(12) United States Patent
Fukuchi

(10) Patent No.: US 7,888,934 B2
(45) Date of Patent: Feb. 15, 2011

(54) MAGNETIC RESONANCE IMAGING APPARATUS

(75) Inventor: Haruyuki Fukuchi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 1110 days.

(21) Appl. No.: 11/777,577

(22) Filed: Jul. 13, 2007

(65) Prior Publication Data

US 2010/0022867 A1 Jan. 28, 2010

(30) Foreign Application Priority Data

Jul. 14, 2006 (JP) ............... 2006-194833

(51) Int. Cl.
G01V 3/00 (2006.01)
(52) U.S. Cl. ...................................... 324/307; 324/322
(58) Field of Classification Search .......... 324/300–322
See application file for complete search history.

(56) References Cited

U.S. PATENT DOCUMENTS

| | | | | |
|---|---|---|---|---|
| 5,736,856 | A * | 4/1998 | Oliver et al. ............. | 324/244.1 |
| 6,223,065 | B1 | 4/2001 | Misic et al. | |
| 6,326,789 | B1 | 12/2001 | Yoshida et al. | |
| 7,123,015 | B2 * | 10/2006 | Koste et al. .................. | 324/322 |
| 7,162,293 | B2 * | 1/2007 | Weiss .......................... | 600/411 |
| 7,173,426 | B1 * | 2/2007 | Bulumulla et al. ........... | 324/318 |
| 7,227,360 | B2 | 6/2007 | Jevtic et al. | |
| 7,443,165 | B2 * | 10/2008 | Varjo .......................... | 324/322 |
| 7,471,224 | B2 * | 12/2008 | Babbitt et al. ................ | 341/133 |
| 7,508,213 | B2 * | 3/2009 | Koste .......................... | 324/322 |
| 7,518,368 | B2 * | 4/2009 | Festag et al. ................. | 324/318 |
| 7,602,187 | B2 * | 10/2009 | Luedeke et al. ............. | 324/318 |
| 2004/0116801 | A1 * | 6/2004 | Konings et al. ............. | 600/411 |

FOREIGN PATENT DOCUMENTS

JP 2000-225106 5/2000
JP 2005-270304 10/2005

* cited by examiner

*Primary Examiner*—Brij B Shrivastav
*Assistant Examiner*—Dixomara Vargas
(74) *Attorney, Agent, or Firm*—Armstrong Teasdale LLP

(57) ABSTRACT

With a view to attaining a high quality of a diagnostic image there is provided a magnetic resonance imaging apparatus wherein an image is formed on the basis of magnetic resonance signals received from a subject with an electromagnetic wave transmitted thereto in a static magnetic field. The magnetic resonance imaging apparatus is provided with plural receiving coil units for receiving the magnetic resonance signals, the receiving coil units each comprising a coil body configured to receive a corresponding one of the magnetic resonance signals and output an electrical signal and an optical modulator configured to use an electric field of the electric signal outputted from the coil body directly as a modulation signal.

15 Claims, 4 Drawing Sheets

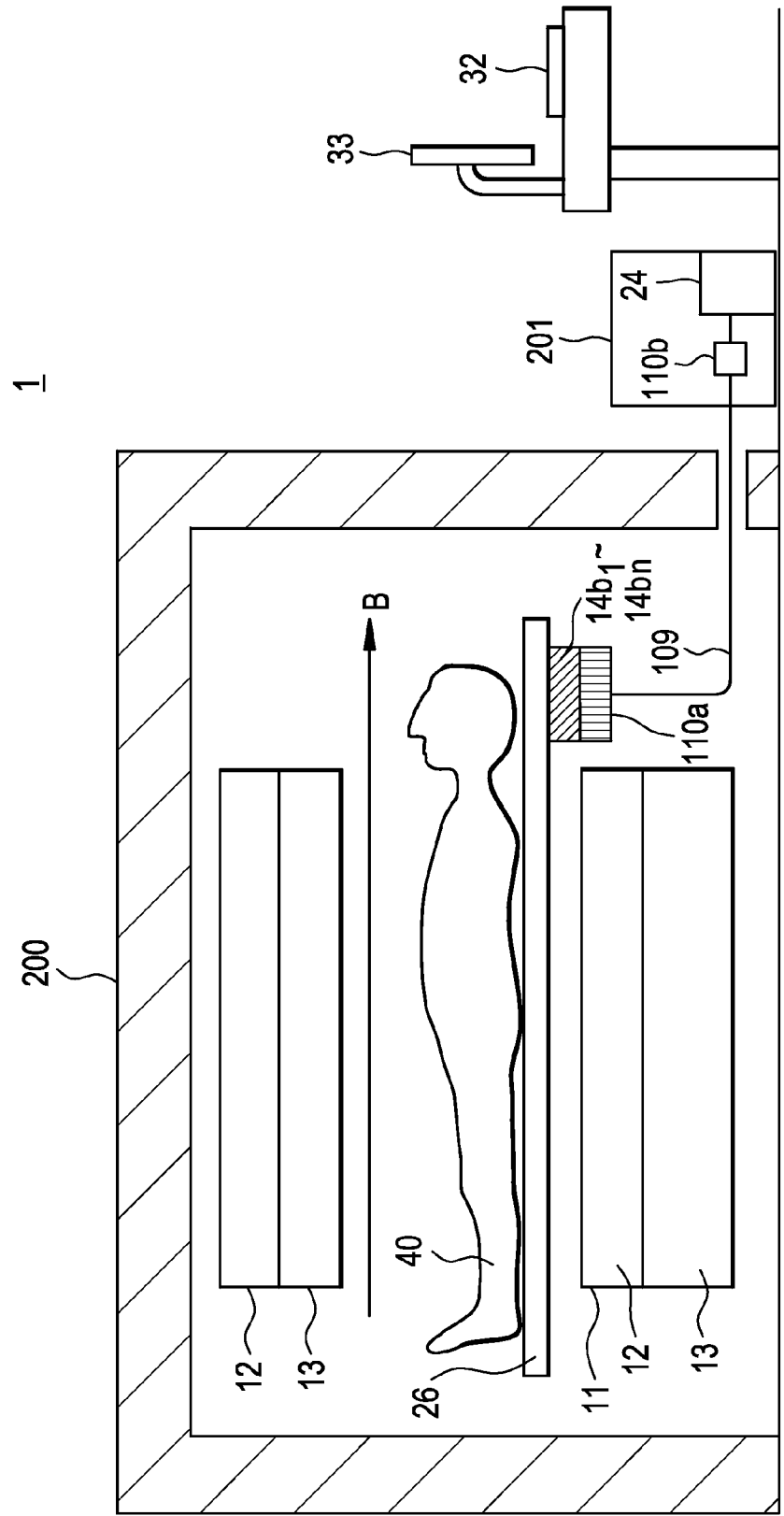

MAGNETIC RESONANCE IMAGING APPARATUS

CROSS REFERENCE TO RELATED APPLICATIONS

This application claims the benefit of Japanese Application No. 2006-194833 filed Jul. 14, 2006.

BACKGROUND OF THE INVENTION

The present invention relates to a magnetic resonance imaging (MRI: Magnetic Resonance Imaging) apparatus. Particularly, the present invention is concerned with a magnetic resonance imaging apparatus of the type in which magnetic resonance signals are collected using plural receiving coils and multiple channels.

Imaging apparatuses, e.g., a magnetic resonance imaging apparatus, are known apparatuses for radiographing a slice image of a tomographic face of a subject and are used in various fields, including medical and industrial fields.

For example, when radiographing a slice image with use of a magnetic resonance imaging apparatus, first a subject is accommodated within a space with a static magnetic field formed therein and the direction of spin of protons present within the subject as a living body is regulated to the direction of the static magnetic field, affording a state of a magnetization vector having been obtained. Thereafter, an electromagnetic wave of a resonance frequency is radiated to the subject from an RF coil, thereby creating a nuclear magnetic resonance phenomenon and causing the magnetization vector of protons in the subject to be changed. Then, in the magnetic resonance imaging apparatus, magnetic resonance signals provided from protons of the subject returning to the original magnetization vector are received by probe coils (receiving coil units) and a slice image is produced on the basis of the received magnetic resonance signals (see, for example, Japanese Unexamined Patent Publication No. 2005-270304).

The magnetic resonance imaging apparatus, using probe coils (receiving coil units), receives magnetic resonance signals provided from a subject with an electromagnetic wave transmitted thereto. The probe coils have an inductance of a conductor and are configured to resonate at a predetermined frequency (see, for example, Japanese Unexamined Patent Publication No. 2000-225106).

In the magnetic resonance imaging apparatus, as probe coils which constitute receiving coil units there are known various shapes of such probe coils, e.g., a combination of plural coil bodies correspondingly to a subject to be radiographed. For example, the probe coils are connected to a data collector for collecting magnetic resonance signals provided from a subject with use of wiring such as coaxial cables.

The portion where the coaxial cables for the transmission of signals from the probe coils are connected to the data collector is constituted by a module board which is provided with plug sockets in a number corresponding to the number of probe coils. The signal provided from each probe coil and inputted to the associated plug socket installed in the module board, constitutes one channel.

The signals provided from the probe coils and inputted to the plug sockets installed in the module board are detected independently channel by channel in the data collector, then are digitized in a data processor and are reconstructed channel by channel, whereby an image is formed on a display of the magnetic resonance imaging apparatus.

Since coaxial cables are used for the transmission of signals from the probe coils to the data collector, there is a fear that there may occur a signal defect due to the inclusion of an electromagnetic noise, with consequent disturbance of an image displayed on a display of an operating unit.

For improving the radiographing speed of the magnetic resonance imaging apparatus there sometimes is adopted a parallel imaging method wherein signals provided from a subject are received in parallel by plural probe coils. For exhibiting the advantage of the parallel imaging method and attaining a high image equality it is considered necessary for the signal from each probe coil to have a high S/N performance.

Heretofore, however, there sometimes has occurred a case where the application of the parallel imaging method is difficult due to the inclusion of noise into coaxial cables, or it is impossible to fully cope with a lowering of S/N ratio which basically occurs with an increase of the radiographing speed. Thus, there also has occurred a problem such that the case to which the parallel imaging method is applicable is actually limited.

In case of collecting magnetic resonance signals through multiple channels in the application of the parallel imaging method, there is a fear of occurrence of crosstalk between signals being transmitted through coaxial cables of the channels. The larger the number of channels, the easier the occurrence of crosstalk. Even within the data collector there sometimes occurs crosstalk between signals in the channels.

SUMMARY OF THE INVENTION

Therefore, it is an object of the present invention to provide magnetic resonance imaging apparatus of the type which collects magnetic resonance signals in multiple channels with use of plural receiving coils and which can achieve a high quality of a diagnostic image.

According to the present invention, for achieving the above-mentioned object, there is provided a magnetic resonance imaging apparatus for generating an image on the basis of magnetic resonance signals received from a subject with an electromagnetic wave transmitted thereto in a static magnetic field, comprising a plurality of receiving coil units for receiving the magnetic resonance signals, the receiving coil units each comprising a coil body configured to receive a corresponding one of the magnetic resonance signals and output an electrical signal and an optical modulator configured to use an electric field of the electrical signal outputted from the coil body directly as a modulation signal for an optical signal.

Preferably, the optical modulator modulates an optical signal inputted into the optical modulator in accordance with the modulation signal and outputs the modulated optical signal to the exterior of the optical modulator.

More preferably, the optical signal is transmitted through an optical fiber.

Still more preferably, the magnetic resonance imaging apparatus further comprises uniting means configured to mutually superimpose and unit the optical signals transmitted through the optical fibers into one and cause the optical signals to be transmitted in the united state through one optical fiber, the types of the optical signals transmitted through the one optical fiber corresponding to the number of the plural receiving coil units.

Still more preferably, the optical signals are transmitted through the one optical fiber in accordance with a wavelength division multiplexing method.

As the uniting means there may be used an AWG wavelength division multiplexer or a prism.

The optical modulator may be an optical modulator utilizing an electro-optical effect. This optical modulator may adopt an external modulation method or a direct modulation method.

According to the magnetic resonance imaging apparatus of the present invention, even if magnetic resonance signals are collected using plural receiving coils and in multiple channels, it is possible to attain a high quality of a diagnostic image.

Further objects and advantages of the present invention will be apparent from the following description of the preferred embodiments of the invention as illustrated in the accompanying drawings.

BRIEF DESCRIPTION OF THE DRAWINGS

FIG. 4 illustrates an example in which the transmission mode of transmitting optical signals including magnetic resonance signals associated with plural receiving coil units to the data collector by adopting the wavelength division multiplexing method is applied to a magnetic resonance imaging apparatus.

DETAILED DESCRIPTION OF THE INVENTION

An embodiment of the present invention will be described hereinunder with reference to FIGS. 1 to 4.

Figure 1:
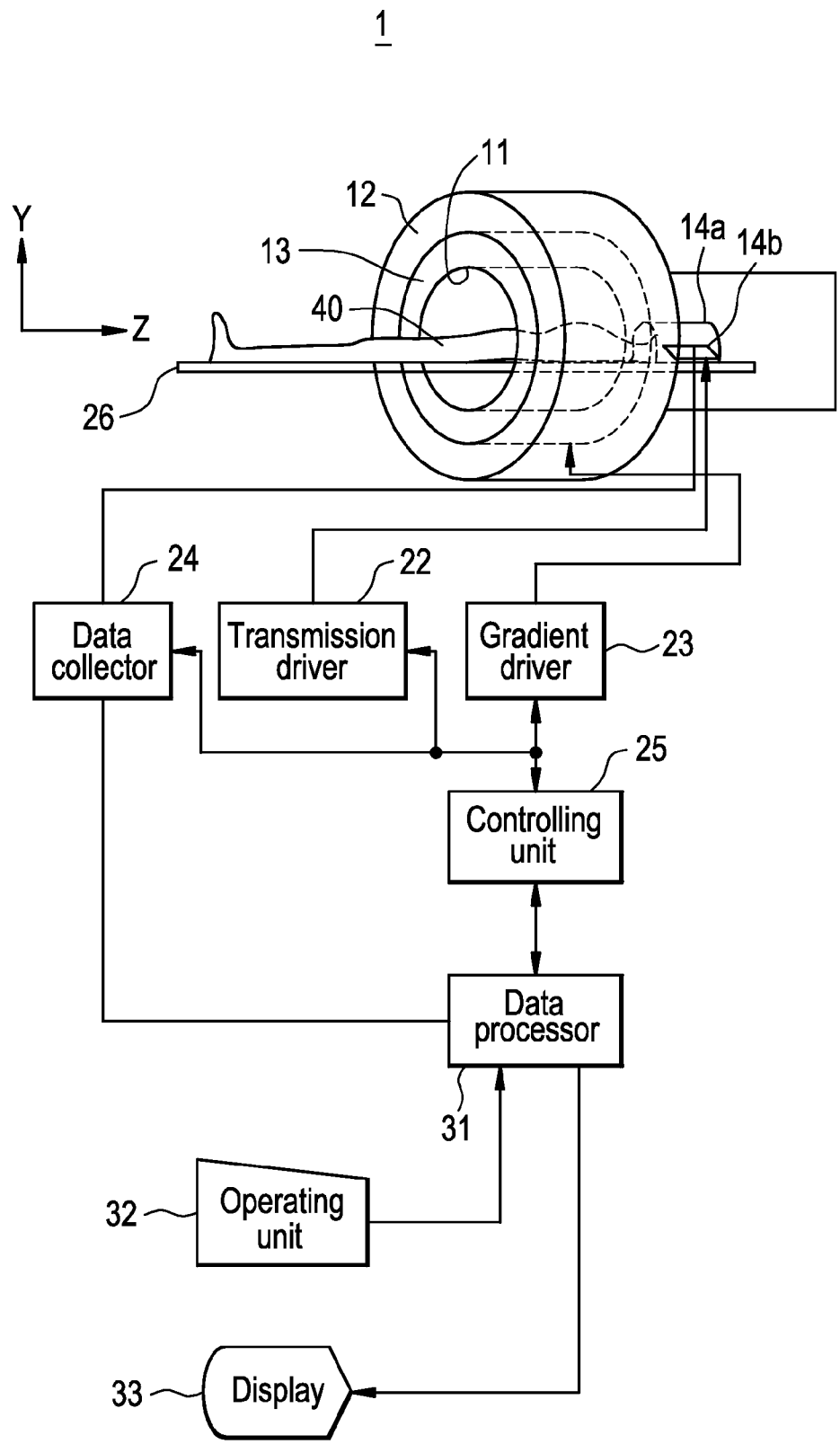
FIG. 1 illustrates the configuration of a magnetic resonance imaging apparatus embodying the present invention.

A magnetic resonance imaging apparatus 1 shown in FIG. 1 includes a static magnetic field-forming magnet unit 12, a gradient coil unit 13, a transmitting coil unit 14a, a receiving coil unit 14b, a transmission driver 22, a gradient driver 23, a data collector 24, a controlling unit 25, a cradle 26, a data processor 31, an operating unit 32, and a display 33.

The static magnetic field-forming magnet unit 12 and the gradient coil unit 13 are disposed around a bore 11 which is a columnar radiographing space. The transmitting coil unit 14a and the receiving coil unit 14b are disposed for example in the head, i.e., a radiographing area, of a subject 40 and, when radiographing the subject, are moved into the bore 11 together with the radiographing area of the subject 40.

Each of the components will be described below one by one.

The static magnetic field-forming magnet unit 12 is configured using a superconducting magnet for example and forms a static magnetic field within the bore 11. As the static magnetic field-forming magnet unit 12 there may be used such a magnetic field generating magnet as a permanent magnet or a normally conductive magnet, in addition to the superconducting magnet. The static magnetic field-forming magnet unit 12 is configured so that the direction of a static magnetic field is parallel to a body axis direction Z of the subject 40.

To let a magnetic resonance signal which the receiving coil unit 14b receives have three-dimensional position information, the gradient coil unit 13 forms a gradient magnetic field for grading the strength of the static magnetic field formed by the static magnetic field-forming magnet unit 12. The gradient coil unit 13 has three gradient coil apparatuses for forming three types of gradient magnetic fields, i.e., slice selecting gradient magnetic field, read gradient magnetic field, and phase encoding gradient magnetic field.

For exciting spin of protons in the radiographing area of the subject 40 and within the bore 11 in which a static magnetic field space is formed by the static magnetic field-forming magnet 12, the transmitting coil unit 14a transmits an RF signal which is an electromagnetic wave signal to form a high frequency magnetic field. The transmitting coil unit 14a has, for example, a volume coil which is disposed so as to surround the whole of the head as the radiographing area of the subject 40.

In the interior of the bore 11 in which a static magnetic field is formed by the static magnetic field-forming magnet unit 12, the receiving coil unit 14b receives as a magnetic resonance signal an electromagnetic wave generated from the protons excited by the transmitting coil unit 14a.

In the magnetic resonance imaging apparatus shown in FIG. 1, the plural receiving coil units 14b are provided. The reason is that it is intended to adopt the parallel imaging method in magnetic imaging, thereby permitting improvement of the radiographing speed.

An internal structure of one of plural receiving coil units 14b in the magnetic resonance imaging apparatus 1 shown in FIG. 1 will be described below with reference to FIG. 2.

Figure 2A:
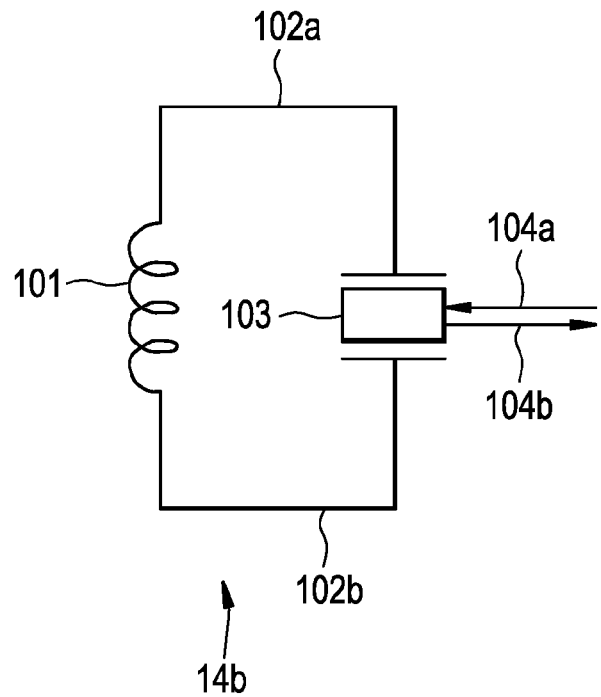
FIG. 2(a) illustrates an internal structure of a receiving coil unit in the magnetic resonance imaging apparatus and FIG. 2(b) is a perspective view of an optical modulator as a constituent of the receiving coil unit.

In FIG. 2(a), the receiving coil unit 14b includes a coil body 101 and a pair of wiring lines 102a and 102b drawn from the coil body 101. An optical modulator 103 is connected to both ends of the pair of wiring lines 102a and 102b. Further, an input-side optical fiber 104a for inputting an optical signal into the optical modulator 103 and an output-side optical fiber 104b for outputting an optical signal to the exterior of the optical modulator 103 are connected to the optical modulator 103.

When the receiving coil unit 14b receives a magnetic resonance signal, the coil body 101 outputs an electrical signal based on an induced electromotive force and an electric field of that electrical signal is generated at both ends of the pair of wiring lines 102a and 102b connected to the coil body. The optical modulator 103 uses the electric field generated at both ends of the paired wiring lines 102a and 102b directly as a modulation signal.

Figure 2B:
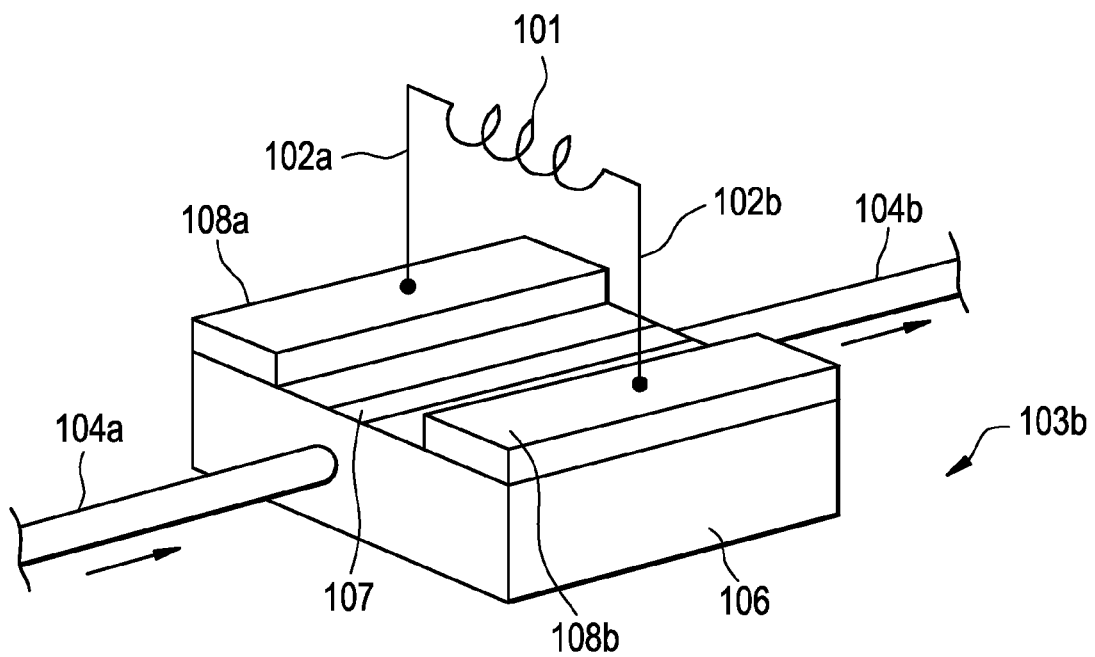

An example of the optical modulator 103 is an optical modulator utilizing an electro-optical effect, such as that shown in FIG. 2(b). The optical modulator shown in FIG. 2(b), indicated at 103b, includes a flat substrate 106 in the shape of rectangular parallelepiped, the substrate 106 being formed by $LiNbO_3$ crystal and exhibiting an electro-optical effect (Pockels effect). A single waveguide 107 is formed longitudinally on the substrate 106 and a pair of electrodes 108a and 108b are formed on both sides of the waveguide 107 on the substrate 106. The wiring lines 102a and 102b of the coil body 101 are connected to the pair of electrodes 108a and 108b, respectively.

An input-side optical fiber 104a and an output-side optical fiber 104b are connected respectively to both ends of the waveguide 107 formed on the substrate 106 which constitutes the optical modulator 103b. When an optical signal is transmitted to the input-side optical fiber 104a, it passes through the waveguide 107 and further through the output-side optical fiber 104b.

With no electric field applied between the pair of electrodes 108a and 108b, the refractive index of the substrate 106 does not change, so that the phase of the input-side optical signal and that of the output-side optical signal do not change.

However, when the receiving coil unit 14b receives a magnetic resonance signal, an induced electromotive force is generated in the coil body 101 and an electric field is applied between the pair of electrodes 108a and 108b, so that the refractive index of the substrate 106 changes due to Pockels effect. Consequently, the phase of the input-side optical signal and that of the output-side optical signal change and the optical signal passing through the input-side optical fiber 104a is modulated while passing through the waveguide 107, which modulated optical signal then passes through the output-side optical fiber 104b.

The optical fibers 104a and 104b in the receiving coil unit 14b which fibers are connected to the optical modulator 103b are exposed to a strong magnetic field generated from the static magnetic field-forming magnet unit 12 in the magnetic resonance imaging apparatus 1 described above, but are not influenced at all by that magnetic field. Therefore, when the magnetic resonance signal received by the receiving coil unit 14b through the optical fibers 104 and 104b is transmitted to the data collector 24, there is no influence of the magnetic field generated from the static magnetic field-forming magnet unit 12. For this reason, a defect is difficult to occur in the signal passing through the optical fibers and it is possible to attain a high S/N ratio. Besides, since a coaxial cable is not used for transmission of the magnetic resonance signal, there is no fear of occurrence of an accident such as a burn caused by heat generated when the cable forms a loop near the subject.

Moreover, since the optical fibers 104a and 104b are used for transmission of the magnetic resonance signal, an electromagnetic induction or noise is difficult to occur upon transmitting the magnetic resonance signal to the data collector 24. Therefore, crosstalk is difficult to occur with respect to not only the signals passing through the optical fibers in the other receiving coil units 14b but also the coil body 101 of the receiving coil unit 14b.

Further, the receiving coil unit 14b uses, directly as a modulation signal, the electric field of an electrical signal which the coil body 101 of the receiving coil unit 14b outputs upon receipt of the magnetic resonance signal. Therefore, within the receiving coil unit 14b, it is not necessary to provide an electronic circuit such as a preamplifier which is likely to disturb the static magnetic field under the influence of the magnetic field generated from the static magnetic field-forming magnet unit 12.

Therefore, in the receiving coil unit 14b, the components, which are influenced by the magnetic field from the static magnetic field-forming magnet unit 12 and disturb the static magnetic field, other than wiring lines connected to the coil body 101 can be eliminated and it is thereby possible to prevent lowering of S/N and the occurrence of susceptibility artifact (image disturbance caused by non-uniform static magnetic field) to the utmost.

In FIG. 1, the receiving coil unit 14b is connected to the data collector 24 through an optical fiber and the magnetic resonance signal received by the receiving coil unit 14b is collected by the data collector 24. Since the magnetic resonance imaging apparatus shown in FIG. 1 has plural receiving coil units 14b, magnetic resonance signals received by the receiving coil units 14b pass through optical fibers drawn out from the respective receiving coil units 14b and are collected by the data collector 24.

In case of transmitting optical signals containing magnetic resonance signals through optical fibers 104a and 104b drawn out from the receiving coil units 14b, it is more preferable to use uniting means. With this uniting means, the optical signals passing through the optical fibers drawn out from the receiving coil units 14b are superimposed one on another and united halfway of transmission, then are transmitted through a single optical fiber. In this united portion it is no longer required to use a large number of optical fibers corresponding to the number of the receiving coil units 14b and a large-sized connector, and it is also possible to reduce the size of the magnetic resonance imaging apparatus.

For providing a united portion into a single optical fiber halfway of the path for transmission of optical signals including magnetic resonance signals in connection with the plural receiving coil units 14b, there may be adopted a wavelength division multiplexing (WDM) method.

Figure 3:
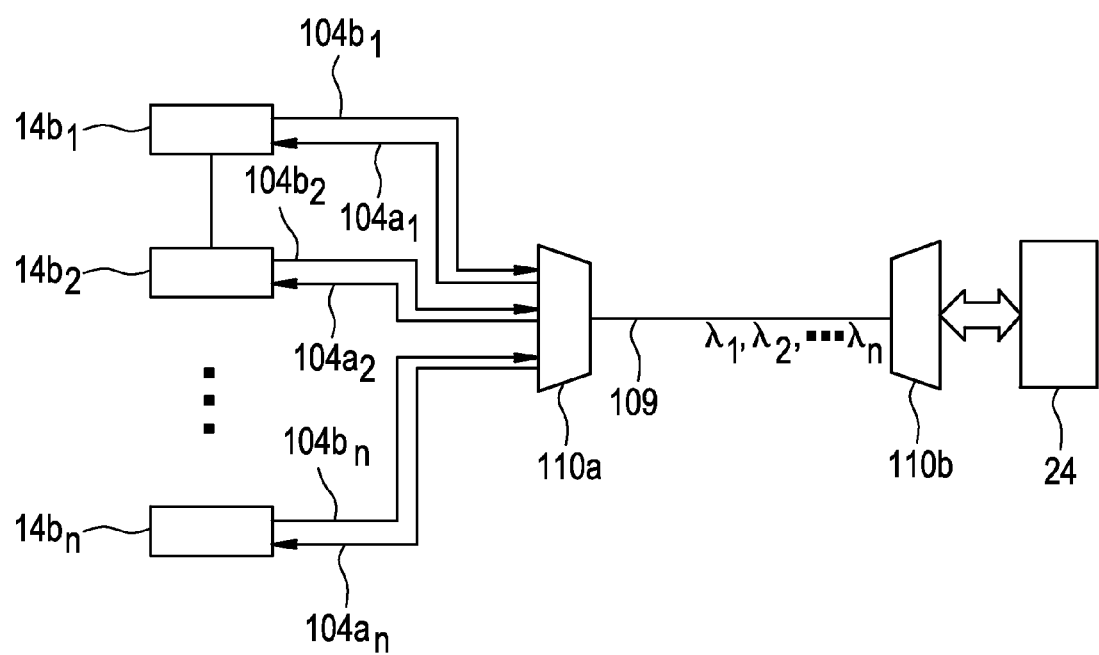
FIG. 3 is a diagram explanatory of a transmission mode in which optical signals including magnetic resonance signals associated with plural receiving coil units are transmitted to a data collector by adopting a wavelength division multiplexing method.

FIG. 3 shows an example of a mode in which optical signals including magnetic resonance signals in connection with the plural receiving coil units 14b are transmitted to the data collector 24 by adopting the wavelength division multiplexing method.

In FIG. 3, there are used n number of receiving coil units $14b_1$ to $14b_n$ each having the coil body and optical modulator described above, and n sets of optical fibers $104a_1$ to $104a_n$ (input) and $104b_1$ to $104b_n$ (output) for input and output of optical signals with respect to the receiving coil units $14b_1$ to $14b_n$ are drawn out from the receiving coil units $14b_1$ to $14b_n$. As to the wavelengths of optical signals transmitted through the optical fibers $104a_1$ to $104a_n$ and $104b_1$ to $104b_n$, there are used n types of wavelengths $\lambda_1$ to $\lambda_n$ corresponding to the number n of the receiving coil units $14b1$ to $14bn$.

The optical fibers $104a_1$ to $104a_n$ and $104b_1$ to $104b_n$ drawn out from the receiving coil units $14b_1$ to $14b_n$ are connected to a first AWG (Arrayed Waveguide Grating) wavelength division multiplexer 110a. The AWG wavelength division multiplexer 110 has a slab waveguide and an array waveguide.

In the AWG wavelength division multiplexer 110, plural optical signals of different wavelengths passing through a single optical fiber 109 are diffracted in the slab waveguide and the array waveguide and are separated wavelength by wavelength, then are transmitted to the input-side optical fibers $104a_1$ to $104a_n$. Further, in the AWG wavelength division multiplexer 110, plural optical signals of different wavelengths passing respectively through the output-side optical fibers $104b_1$ to $104b_n$ are combined together in the slab waveguide and the array waveguide and are transmitted to a single optical fiber which will be described later. That is, the AWG wavelength division multiplexer 110 serves as uniting means which superimposes the optical signals passing through the optical fibers drawn out from the receiving coil units $14b_1$ to $14b_n$ into one and causes them to pass in this united state through a single optical fiber. In case of using a prism instead of the AWG wavelength division multiplexer 110 as the uniting means, it is possible to reduce the fabrication cost.

One end of the one optical fiber 109 is connected to the first AWG wavelength division multiplexer 110a. Optical signals of n types ($\lambda_1$ to $\lambda_n$) of wavelengths are transmitted to the one optical fiber 109. A second AWG wavelength division multiplexer 110b is connected to the other end of the optical fiber 109. The second AWG wavelength division multiplexer 110b inputs and outputs optical signals of n types of wavelengths to and from the data collector 24.

When inputting optical signals of n types ($\lambda_1$ to $\lambda_n$) of wavelength from the second AWG wavelength division multiplexer 110b to the one optical fiber 109, it is necessary to use a light source. As the light source there may be used, for example, a DFB (Distributed FeedBack) semiconductor laser. With use of the DFB semiconductor laser, it is possible to obtain signal light of a single spectrum with precisely controlled wavelengths $\lambda_1$ to $\lambda_n$.

Even when transmitting n types (n channels) of signal light beams through the one optical fiber 109, it is possible to prevent crosstalk of those signal light beams.

As the light source, no limitation is made to the use of n units of DFB semiconductor lasers. There may be used a single semiconductor laser using a wavelength converter. With such a single semiconductor laser, it is possible to generate signal light beams of n types of wavelengths $\lambda_1$ to $\lambda_n$. The semiconductor laser(s) serving as the light source may be installed within or outside the data collector 24.

FIG. 4 shows an example in which the mode of transmitting optical signals including magnetic resonance signals associated with the plural receiving coil units $14b_1$ to $14b_n$ to the data collector is applied to an actual magnetic resonance imaging apparatus by adopting the wavelength division multiplexing method shown in FIG. 3.

In the magnetic resonance imaging apparatus shown in FIG. 4 and indicated at 1, a bore 11 as a columnar radiographing space is formed within a radiographing room 200. The bore 11, which constitutes a radiographing apparatus body, includes a static magnetic field-forming magnet unit 12 and a gradient coil unit 13. A controller 201, an operating unit 32 and a display 33 are installed outside the radiographing room 200.

Since the bore 11 as a columnar radiographing space includes the static magnetic field-forming magnet unit 12 and the gradient coil unit 13, a strong magnetic field B is generated within the bore 11. A cradle 26 for placing a subject 40 thereon is installed within the space with the magnetic field B generated therein.

The transmission driver 22, gradient driver 23, data collector 24 and controlling unit 25 shown in FIG. 1 are accommodated within the controller 201. However, of these devices, only the data collector 24 is shown in its accommodated state in FIG. 3 for illustration purpose.

In the interior of the bore 11 in which a static magnetic field space is formed by the static magnetic field-forming magnet unit 12, n number of receiving coil units $14b_1$ to $14b_n$ are illustrated in FIG. 4 for receiving, as magnetic resonance signals, electromagnetic waves generated from protons which are excited by transmitting coil units (not shown).

As shown in FIG. 4, the receiving coil units $14b_1$ to $14b_n$ are installed near the bore 11 which is installed in the interior of the radiographing room 200 and in which the strong magnetic field B is generated. Consequently, the receiving coil units $14b_1$ to $14b_n$ are also exposed to the strong magnetic field B. However, as described above in connection with FIG. 2(b), the receiving coil units $14b_1$ to $14b_n$ are little influenced by the magnetic field B because there is used the principle that the electric field of an electrical signal outputted from the coil body is used directly as a modulation signal.

In FIG. 4 there is shown the first AWG wavelength division multiplexer 110a which is connected to optical fibers (not shown) drawn out from the receiving coil units $14b_1$ to $14b_n$. The AWG wavelength division multiplexer 110a superimposes and unites optical signals passing through plural optical fibers drawn out from the receiving coil units $14b_1$ to $14b_n$ into one and transmits them in the thus-united state to the one optical fiber 109.

As shown in FIG. 4, the optical fiber 109 conducts the superimposed optical signals to the exterior of the radiographing room 200. The optical fiber 109 is laid within the radiographing room 200 in which the strong magnetic field B is present. However, from the nature of the optical fiber, the optical signals transmitted through the optical fiber laid within the radiographing room 200 are not influenced at all by the magnetic field B present within the radiographing room 200.

The optical fiber 109 laid outside the radiographing room 200 is led to the controller 201, then an end thereof thus led to the controller 201 is connected to a second AWG wavelength division multiplexer 110b.

The second AWG wavelength division multiplexer 110b inputs and outputs optical signals of n types of wavelengths passing through the optical fiber 109 to and from the data collector 24. The data collector 24 includes an electro-optic converter and an opto-electric converter. Thus, not only optical signals but also electrical signals are processed in the interior of the data collector 24. However, the data collector 24 is spaced away from the bore 11 in which the strong magnetic field B is generated and is installed outside the radiographing room 200 which is shielded from electronic radio waves. Therefore, despite electrical signals being processed in the data collector 24, the electrical signals are not influenced by the magnetic field B.

An input-side optical fiber 104a and an output-side optical fiber 104b are connected to the optical modulator 103 described above in connection with FIG. 2. An optical signal inputted from the input-side optical fiber 104a to the optical modulator 103 is modulated and the modulated optical signal is outputted to the output-side optical fiber 104b. In this case, the optical modulator 103 is based on the external modulation method wherein the optical signal inputted to the optical modulator is modulated and the modulated optical signal is outputted to the exterior of the optical modulator. However, as the optical modulator there may be adopted a direct modulation type optical modulator wherein a change of a modulation signal is used directly as a change in intensity of the light source. In this case, the input-side optical fiber 104a becomes unnecessary. It also becomes unnecessary to use the light source for inputting optical signals of n types of wavelengths $\lambda_1$ to $\lambda_n$ from the second AWG wavelength division multiplexer 110b to the one optical fiber 109.

As the optical modulator adopting the direct modulation method there may be used, for example, a DFB semiconductor laser incorporating an EA (Electro Absorption) modulator. The EA modulator is an optical device having a function of modulating at high speed the intensity of light incoming from an entrance port and outputting the modulated light to an output port with use of the electro-absorption effect of a semiconductor. The DFB semiconductor laser incorporating an EA modulator comprises a single EA modulator integrated with a DFB semiconductor laser on one and same substrate.

By using the DFB semiconductor laser incorporating an EA modulator it is possible to attain the reduction of size and diminish the voltage required for modulation in comparison with the external modulation type optical modulator shown in FIG. 2(b).

If the voltage required for modulation can be diminished, then in the case where the electric field of the electrical signal outputted from the coil body 101 of the receiving coil unit 14b is used directly as a modulation signal, it is possible to greatly improve the sensitivity of the optical modulator. That is, the lowering of S/N can be prevented to the utmost, and even in the case where magnetic resonance signals are collected in multiple channels using plural receiving coils, the quality of the image to be diagnosed can be further improved. Since it is possible to attain the reduction in size of the DFB semiconductor laser incorporating an EA modulator, it is also possible to attain the reduction in size of the body of the magnetic resonance imaging apparatus in comparison with the optical modulator adopting the direct modulation method.

The optical modulator 103b described above in connection with FIG. 2(b) uses LiNbO$_3$ crystal having Pockels effect. Such crystals as BaTiO$_3$, KH$_2$PO$_4$ (KHP) and KD$_2$PO$_4$ (KDP) are also employable because they also exhibit Pockels effect.

The optical modulator to be used is not limited to one that utilizes Pockels effect, but may be any other optical modulator insofar as the optical modulator adopted utilizes an electro-optical effect.

That is, since the optical modulator used in the magnetic resonance imaging apparatus of the present invention uses, directly as a modulation signal, the electric field of the electric signal outputted from the coil body of each receiving coil unit, there may be used any optical modulator utilizing an electro-optical effect such that the refractive index varies depending on the electric field.

For example, there may be used an optical modulator using a crystal which exhibits Kerr effect. The crystal which exhibits Kerr effect can improve the sensitivity of the optical modulator because the refractive index thereof changes in proportion to the square of an electric field. Consequently, it is possible to prevent the lowering of S/N in the magnetic resonance imaging apparatus.

Particularly, KTa$_{1-x}$Nb$_x$O$_3$ exhibits a particularly outstanding Kerr effect and therefore an optical modulator using the crystal of KTa$_{1-x}$Nb$_x$O$_3$ is particularly improved in its sensitivity.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus for generating an image on the basis of magnetic resonance signals received from a subject with an electromagnetic wave transmitted thereto in a static magnetic field, comprising:
   a plurality of receiving coil units for receiving the magnetic resonance signals, the receiving coil units each comprising a coil body configured to receive a corresponding one of the magnetic resonance signals and output an electrical signal and an optical modulator configured to use an electric field of the electrical signal outputted from the coil body directly as a modulation signal for an optical signal, wherein the optical signal is transmitted through an optical fiber; and
   a uniting device configured to mutually superimpose and unite the optical signals from each of the plurality of receiving coil units and cause the optical signals to be transmitted in a united state through one optical fiber, the types of optical signals transmitted through the one optical fiber corresponding to a number of receiving coil units in the plurality of receiving coil units.

2. A magnetic resonance imaging apparatus according to claim 1, wherein the optical modulator modulates an optical signal inputted into the optical modulator in accordance with the modulation signal and outputs the modulated optical signal to the exterior of the optical modulator.

3. A magnetic resonance imaging apparatus according to claim 2, wherein the optical modulator is an optical modulator utilizing an electro-optical effect.

4. A magnetic resonance imaging apparatus according to claim 3, wherein the electro-optical effect is Pockels effect.

5. A magnetic resonance imaging apparatus according to claim 4, wherein the optical modulator uses any of BaTiO$_3$, KH$_2$PO$_4$ (KHP), KD$_2$PO$_4$ (KDP) and LiNbO$_3$ crystals.

6. A magnetic resonance imaging apparatus according to claim 3, wherein the electro-optical effect is Kerr effect.

7. A magnetic resonance imaging apparatus according to claim 6, wherein the optical modulator uses the crystal of KTa$_{1-x}$Nb$_x$O$_3$.

8. A magnetic resonance imaging apparatus according to claim 2, wherein the optical modulator is an external modulation type optical modulator.

9. A magnetic resonance imaging apparatus according to claim 8, wherein a light source of the optical signals is a DFB semiconductor laser.

10. A magnetic resonance imaging apparatus according to claim 8, wherein a light source of the optical signals is a single semiconductor laser using a wavelength converter.

11. A magnetic resonance imaging apparatus according to claim 2, wherein the optical modulator is a direct modulation type optical modulator.

12. A magnetic resonance imaging apparatus according to claim 11, wherein the optical modulator is a DFB semiconductor laser with an EA modulator installed therein.

13. A magnetic resonance imaging apparatus according to claim 4 claim 1, wherein the optical signals are transmitted through the one optical fiber in accordance with a wavelength division multiplexing method.

14. A magnetic resonance imaging apparatus according to claim 1, wherein the uniting device is an AWG wavelength division multiplexer.

15. A magnetic resonance imaging apparatus according to claim 1, wherein the uniting device is a prism.

* * * * *